(12) United States Patent
Yoshimochi

(10) Patent No.: US 9,450,087 B2
(45) Date of Patent: Sep. 20, 2016

(54) SEMICONDUCTOR DEVICE, AND MANUFACTURING METHOD FOR SAME

(71) Applicant: ROHM CO., LTD., Kyoto (JP)

(72) Inventor: Kenichi Yoshimochi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/711,858

(22) Filed: May 14, 2015

(65) Prior Publication Data

US 2015/0270386 A1    Sep. 24, 2015

Related U.S. Application Data

(62) Division of application No. 13/699,616, filed as application No. PCT/JP2011/063173 on Jun. 8, 2011, now Pat. No. 9,041,100.

(30) Foreign Application Priority Data

Jun. 9, 2010    (JP) ................. 2010-132332

(51) Int. Cl.
*H01L 29/78* (2006.01)
*H01L 29/417* (2006.01)
*H01L 29/423* (2006.01)
(Continued)

(52) U.S. Cl.
CPC ..... *H01L 29/7813* (2013.01); *H01L 29/41766* (2013.01); *H01L 29/4236* (2013.01); *H01L 29/42372* (2013.01); *H01L 29/4925* (2013.01); *H01L 29/66727* (2013.01); *H01L 29/66734* (2013.01); *H01L 29/7811* (2013.01); *H01L 29/1095* (2013.01); *H01L 29/4238* (2013.01); *H01L 29/456* (2013.01)

(58) Field of Classification Search
CPC ............. H01L 29/7813; H01L 29/66734; H01L 29/66666; H01L 29/7811
USPC .......................................... 438/270
See application file for complete search history.

(56) References Cited

U.S. PATENT DOCUMENTS

| 5,721,148 A | 2/1998 | Nishimura |
| 2004/0222459 A1* | 11/2004 | Yoshimochi ........ H01L 29/7813 257/330 |

(Continued)

FOREIGN PATENT DOCUMENTS

| JP | 8-083907 A | 3/1996 |
| JP | 9-219519 A | 8/1997 |

(Continued)

*Primary Examiner* — Tran Tran
(74) *Attorney, Agent, or Firm* — Rabin & Berdo, P.C.

(57) ABSTRACT

A semiconductor device has a source region, a channel region, and a drain region disposed in order from the surface of the device in the thickness direction of a semiconductor substrate. The semiconductor device includes a source metal embedded in a source contact groove penetrating the source region and reaching the channel region, a gate insulating film formed on the side wall of a gate trench that is formed so as to penetrate the source region and the channel and reach the drain region, a polysilicon gate embedded in the gate trench so that at least a region facing the channel region in the gate insulating film is covered with the polysilicon gate and so that all of the polysilicon gate is placed under a surface of the source region, and a gate metal that is embedded in a gate contact groove formed in the polysilicon gate so as to reach the depth of the channel region and that is in contact with the polysilicon gate.

11 Claims, 18 Drawing Sheets

(51) Int. Cl.
  *H01L 29/66* (2006.01)
  *H01L 29/49* (2006.01)
  H01L 29/10 (2006.01)
  H01L 29/45 (2006.01)

(56) References Cited

U.S. PATENT DOCUMENTS

2006/0065925 A1 3/2006 Yoshida
2006/0124995 A1 6/2006 Ninomiya et al.
2008/0079081 A1 4/2008 Hashimoto
2008/0303081 A1* 12/2008 Hshieh ............... H01L 24/05
                                                        257/328

FOREIGN PATENT DOCUMENTS

| JP | 2001-250948 A | 9/2001 |
| JP | 2006-100494 A | 4/2006 |
| JP | 2006-165441 A | 6/2006 |
| JP | 2008-085278 A | 4/2008 |

* cited by examiner

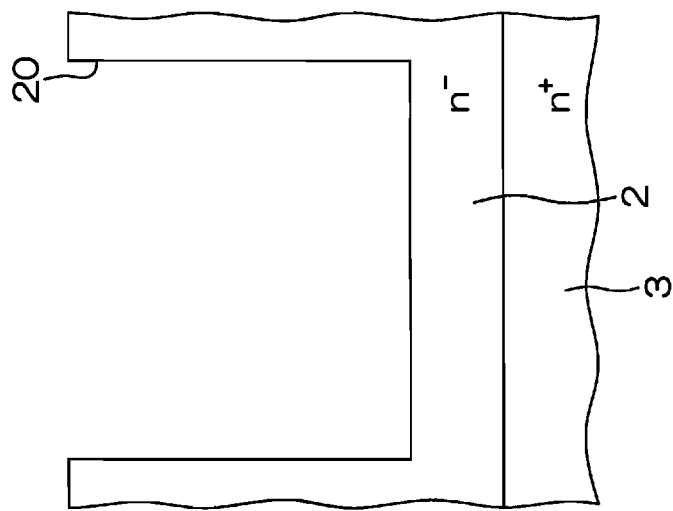
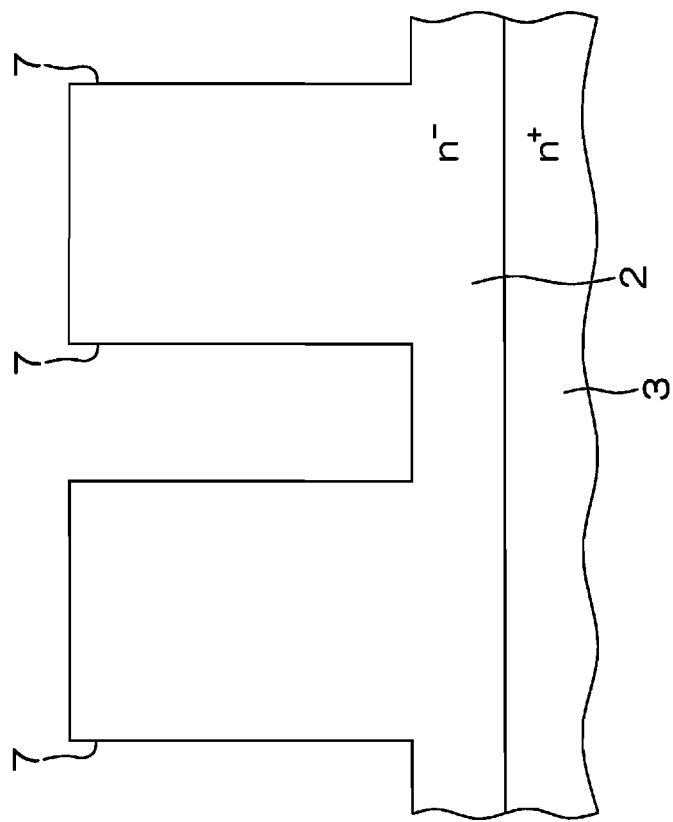

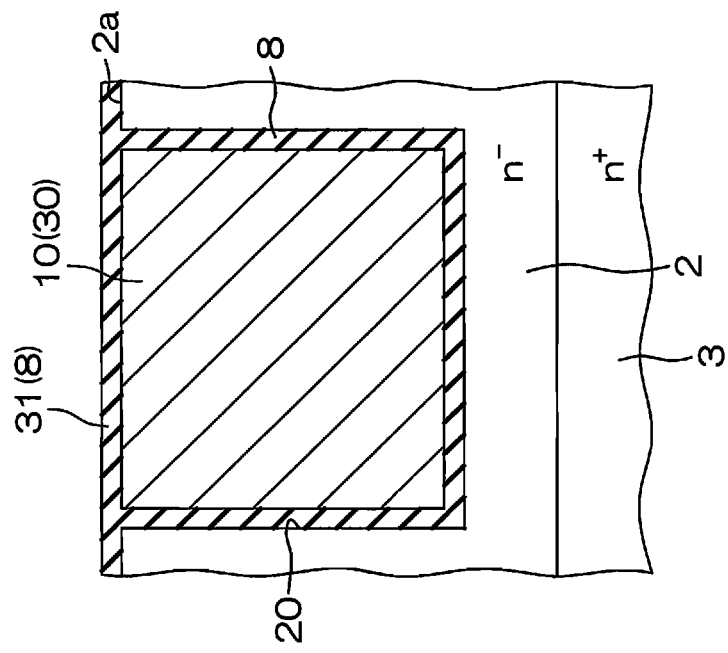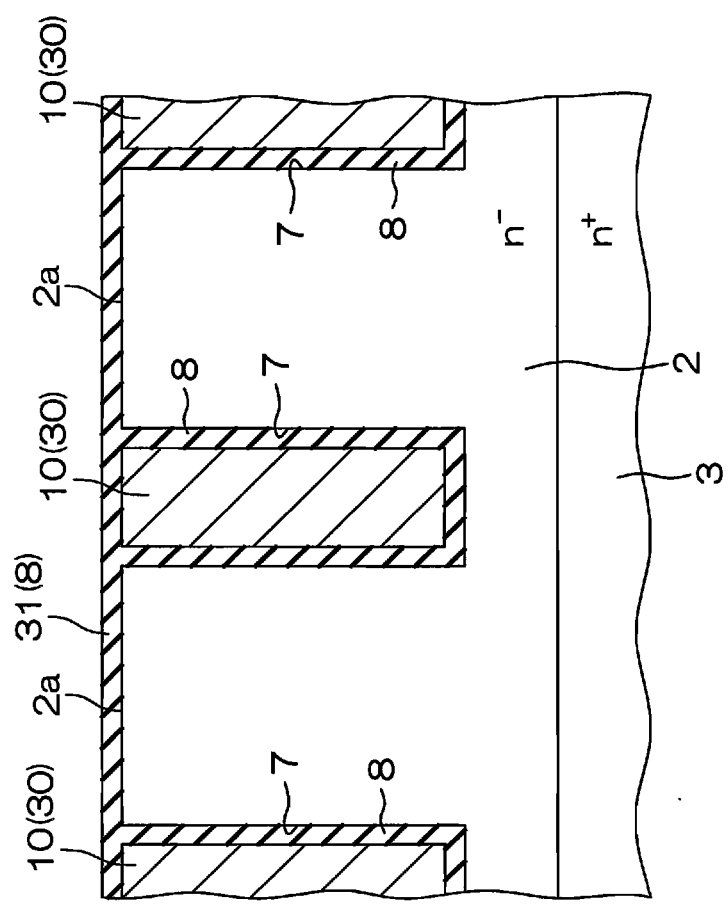

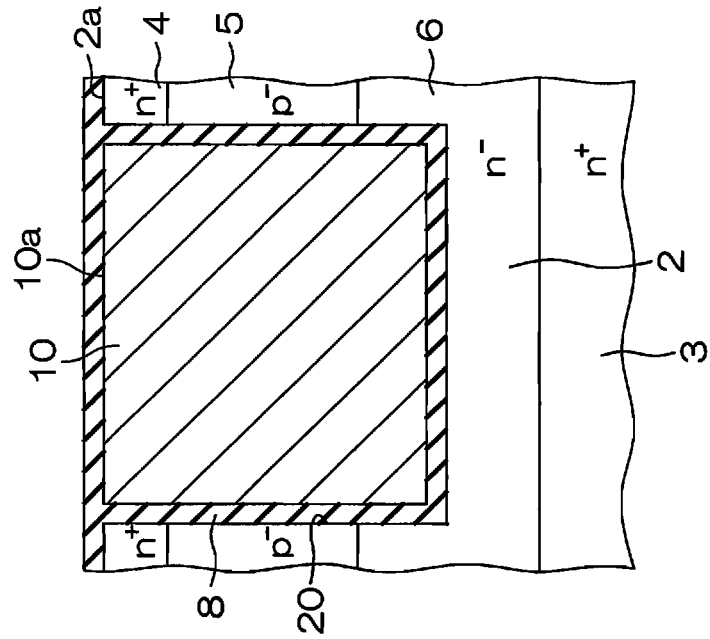
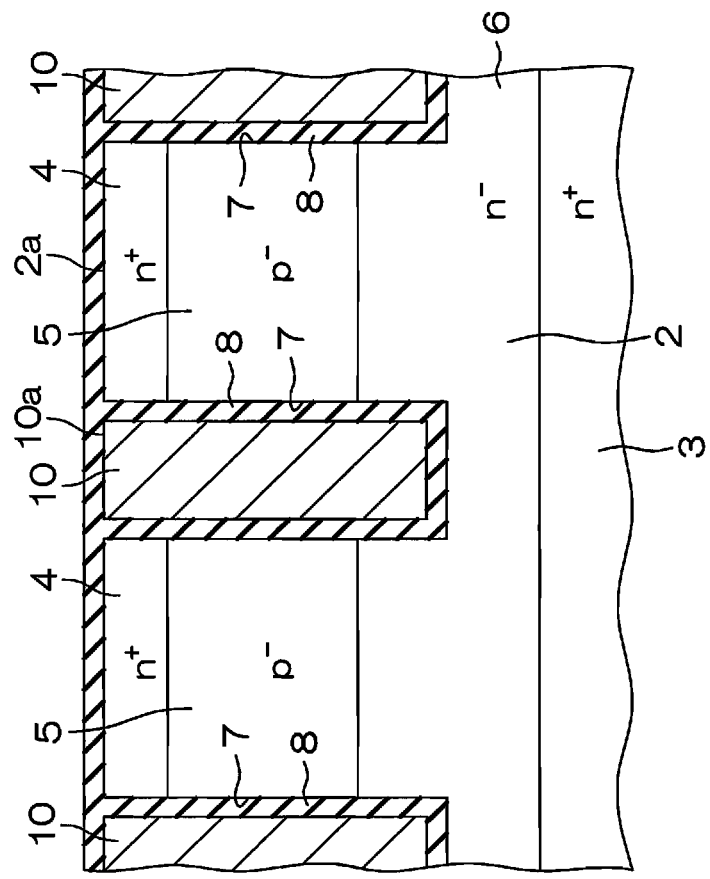

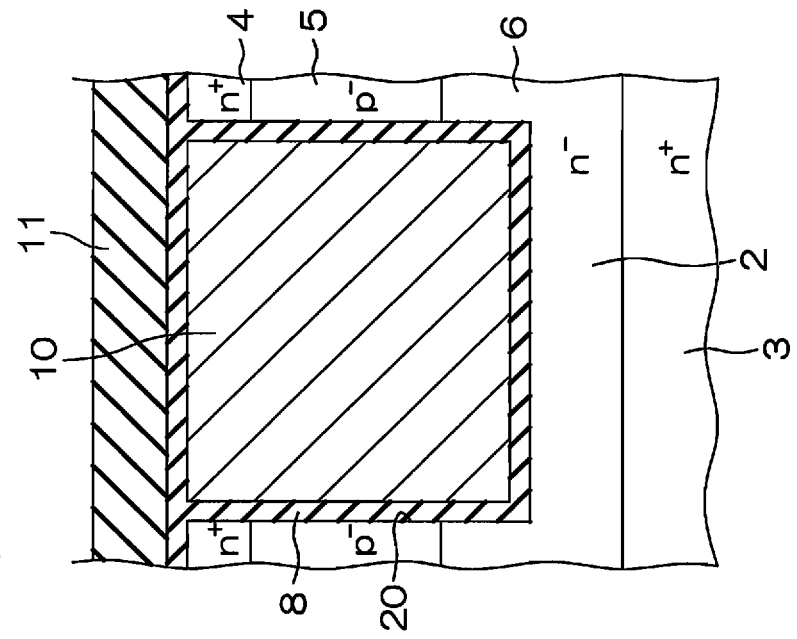
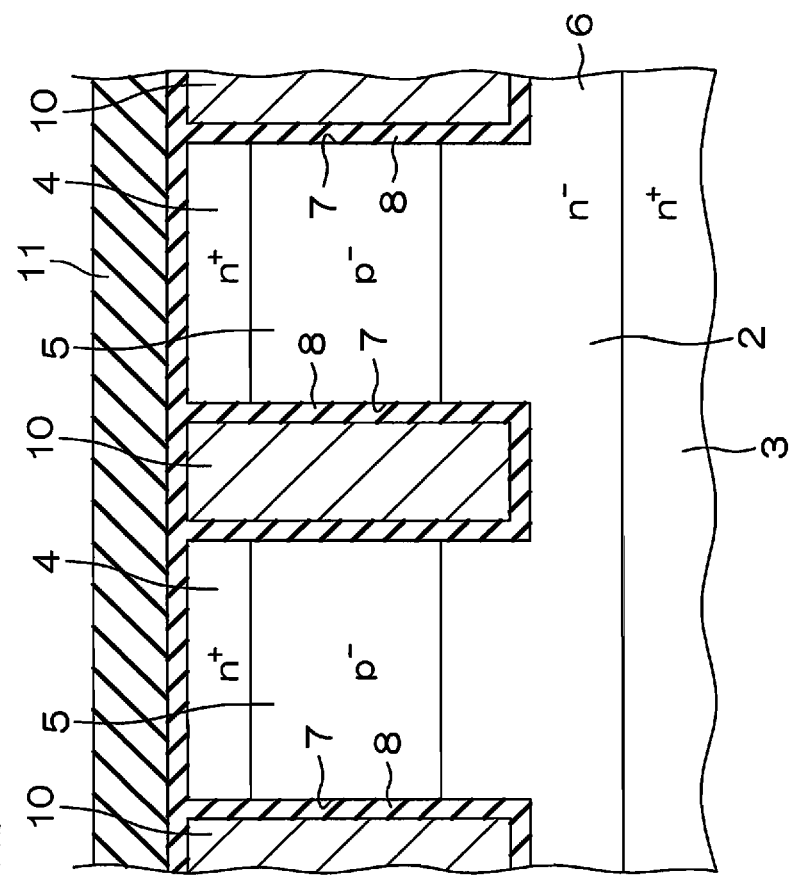

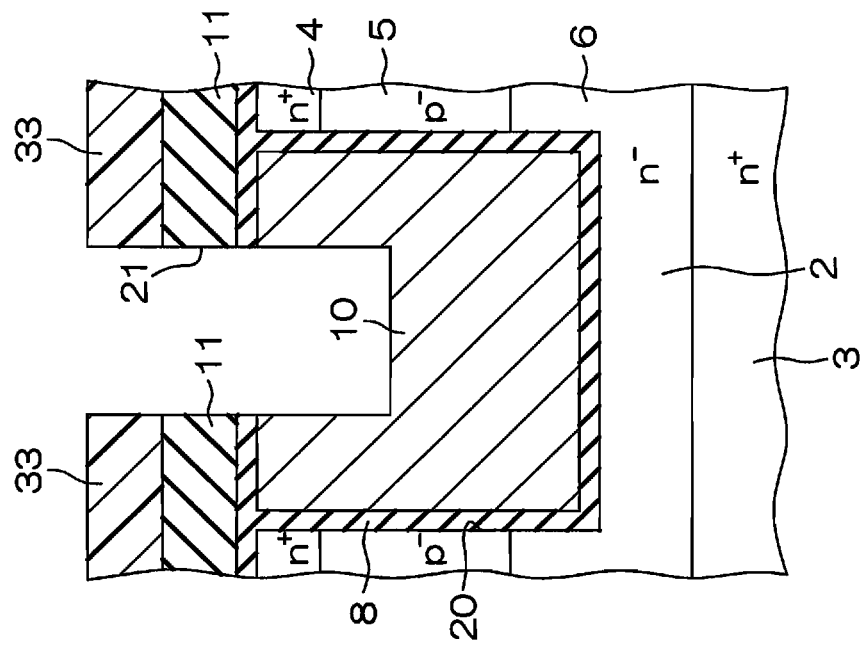
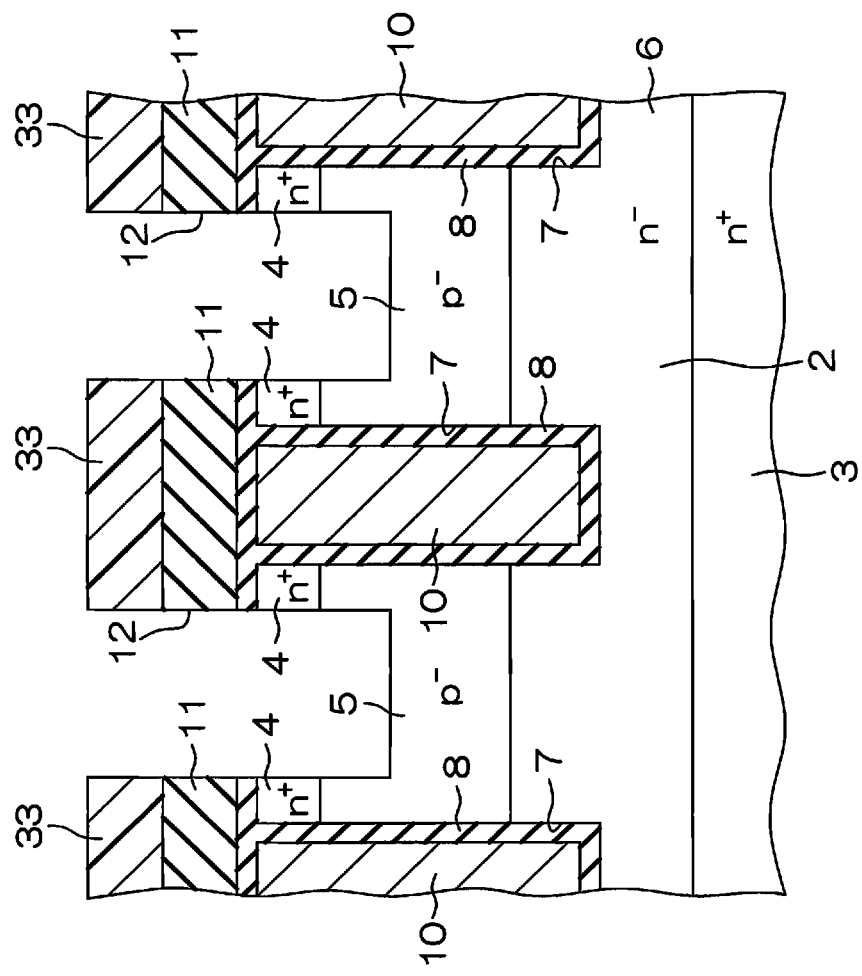

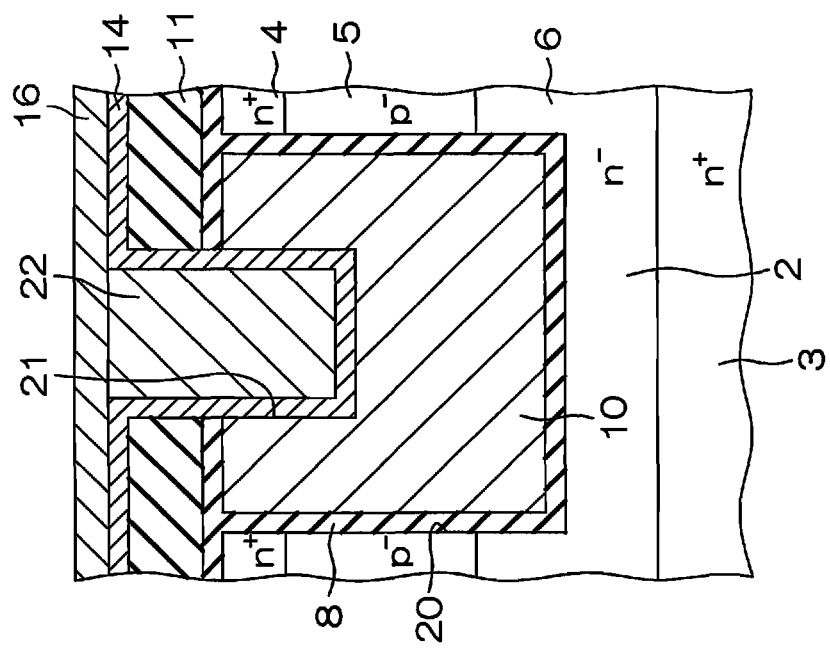
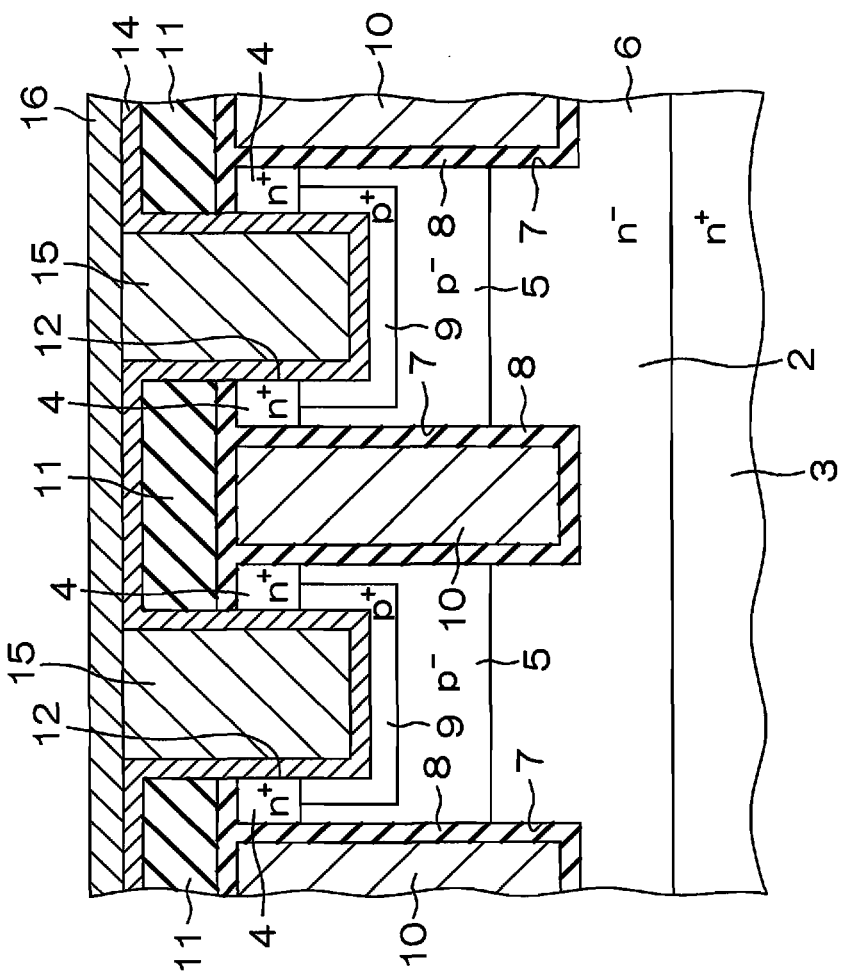

SEMICONDUCTOR DEVICE, AND MANUFACTURING METHOD FOR SAME

CROSS REFERENCE TO RELATED APPLICATIONS

This is a continuation of U.S. application Ser. No. 13/699,616, filed on Nov. 21, 2012. The prior U.S. application and the present application claim the benefit of priority of PCT/JP2011/063173, filed on Jun. 8, 2011, and Japanese application 2010-132332, filed on Jun. 9, 2010. The disclosures of these prior U.S. and foreign applications are incorporated herein by reference

TECHNICAL FIELD

The present invention relates to a semiconductor device having a trench gate structure and a method of manufacturing the semiconductor device.

BACKGROUND ART

A trench gate structure is used, for example, in power MOSFETs (Metal-Oxide-Semiconductor Field Effect Transistors). The trench gate structure includes a gate oxide film formed on an inner wall surface of a trench formed on a semiconductor substrate and a polysilicon gate embedded in the trench so as to be contiguous to the gate oxide film. The semiconductor substrate has a source region, a channel region, and a drain region formed in order from the surface of a semiconductor device in the thickness direction of the semiconductor substrate. The trench penetrates the source region and the channel region, and reaches the drain region. Therefore, the polysilicon gate faces the source region, the channel region, and the drain region through the gate oxide film. A MOSFET is arranged in this way.

A connection of a gate electrode to the polysilicon gate is performed in an area outside the trench. Therefore, the polysilicon gate has a stranded portion that has been drawn out from the inside of the trench and that has been stranded on regions on the semiconductor substrate outside the trench. The gate electrode is connected to the stranded portion.

CITATION LIST

Patent Literature

Patent Literature 1: Japanese Published Unexamined Patent Application No. H8-83907

SUMMARY OF INVENTION

Technical Problem

Generally, a gate insulating film is formed to cover not only the inner wall of the trench but also the surface of the semiconductor substrate outside the trench. Therefore, the gate insulating film leads from the inner wall surface of the trench to the outside of the trench through its opening edge. The polysilicon gate is formed on the surface of the thus-arranged gate insulating film.

However, at the opening edge of the trench, the gate insulating film is bent from a normal direction of the semiconductor substrate in a direction along a principal surface of the semiconductor substrate. In this bent part, the film thickness of the gate insulating film becomes thinner than in other parts. Therefore, in the opening edge of the trench, the semiconductor substrate and the polysilicon gate face each other with the thin gate insulating film therebetween. Additionally, the edge of the semiconductor substrate is placed at the opening edge of the trench, and therefore an electric field is liable to be concentrated there. Therefore, a dielectric breakdown of the gate insulating film easily occurs in the opening edge of the trench.

In order to avoid this problem, it is conceivably possible to employ a structure to limit the formation region of the polysilicon gate to the inside of the trench and to join the gate electrode to the polysilicon gate in a region in the trench. This structure makes it possible to avoid the problem of the dielectric breakdown of the gate insulating film because an electric field is not applied to the gate insulating film in the opening edge of the trench.

In a process for producing this structure, a gate contact hole to be formed in an interlayer insulating film with which the semiconductor substrate is covered is formed in a region corresponding to the inside of the trench. The gate electrode is formed so as to be contiguous to the polysilicon gate through the gate contact hole. Additionally, a source contact hole is formed in the interlayer insulating film in a region outside the trench. A source electrode is formed so as to be contiguous to the source region through the source contact hole. The source electrode is required to be also contiguous to the channel region. Therefore, the source contact hole is formed by etching the semiconductor substrate so as to penetrate the source region and to reach the channel region.

While the gate contact hole is merely required to reach the polysilicon gate, the source contact hole has a need to reach the channel region, and therefore these contact holes differ from each other in depth. Therefore, these contact holes are required to be formed at different process steps, respectively, and therefore the number of steps becomes large, and, accordingly, costs will rise. Therefore, another such problem to be solved still remains even if the problem of the dielectric breakdown is solved.

Although the number of steps can be reduced if the gate contact hole and the source contact hole are formed at the same step, these contact holes have the same depth. In other words, when the semiconductor substrate is etched to form the source contact hole, polysilicon in the gate trench is etched to the same depth. The source contact hole must reach the channel region, and therefore the bottom surface of the gate contact hole is placed at a depth that is equivalent to a point of the layer thickness of the channel region. Therefore, the polysilicon is embedded in a region deeper than the bottom surface of the gate contact hole in the gate trench, and a metal of which the gate electrode is made is embedded in a region shallower than the depth. As a result, the polysilicon faces a part of the channel region, and the metal faces other parts thereof. Therefore, it becomes difficult to obtain performance (characteristics) exactly according to a predetermined design because characteristics of a threshold voltage and others differ from those obtained when the polysilicon faces the whole in the depth range of the channel region.

It is an object of the present invention to provide a semiconductor device and a method of manufacturing the semiconductor device capable of reducing the number of manufacturing process steps without sacrificing its performance and capable of having a sufficient amount of resistance against a breakdown.

Solution to Problem

The present invention provides a semiconductor device that has a source region, a channel region, and a drain region disposed in order from a surface of the semiconductor device in a thickness direction of a semiconductor substrate. The semiconductor device includes a source metal embedded in a source contact groove penetrating the source region and reaching the channel region, a gate insulating film formed on a side wall of a gate trench which is formed so that the gate trench penetrates the source region and the channel region and reaches the drain region, a polysilicon gate embedded in the gate trench so that at least a region facing the channel region in the gate insulating film is covered with the polysilicon gate and so that all of the polysilicon gate is placed under a surface of the source region (i.e., under a surface of semiconductor layers), and a gate metal that is embedded in a gate contact groove formed in the polysilicon gate so as to reach a depth of the channel region and that is in contact with the polysilicon gate.

The aforementioned or other objects, features, and effects of the present invention will be clarified by the following description of embodiments with reference to the accompanying drawings.

BRIEF DESCRIPTION OF DRAWINGS

FIG. 6A and FIG. 6B are schematic sectional views for describing manufacturing process steps of the semiconductor device according to the first embodiment.

FIG. 8A and FIG. 8B are schematic sectional views for describing steps subsequent to those shown in FIG. 7A and FIG. 7B.

FIG. 9A and FIG. 9B are schematic sectional views for describing steps subsequent to those shown in FIG. 8A and FIG. 8B.

FIG. 10A and FIG. 10B are schematic sectional views for describing steps subsequent to those shown in FIG. 9A and FIG. 9B.

FIG. 11A and FIG. 11B are schematic sectional views for describing steps subsequent to those shown in FIG. 10A and FIG. 10B.

FIG. 15A and FIG. 15B are schematic sectional views for describing steps subsequent to those shown in FIG. 14A and FIG. 14B.

DESCRIPTION OF EMBODIMENTS

Figure 1:
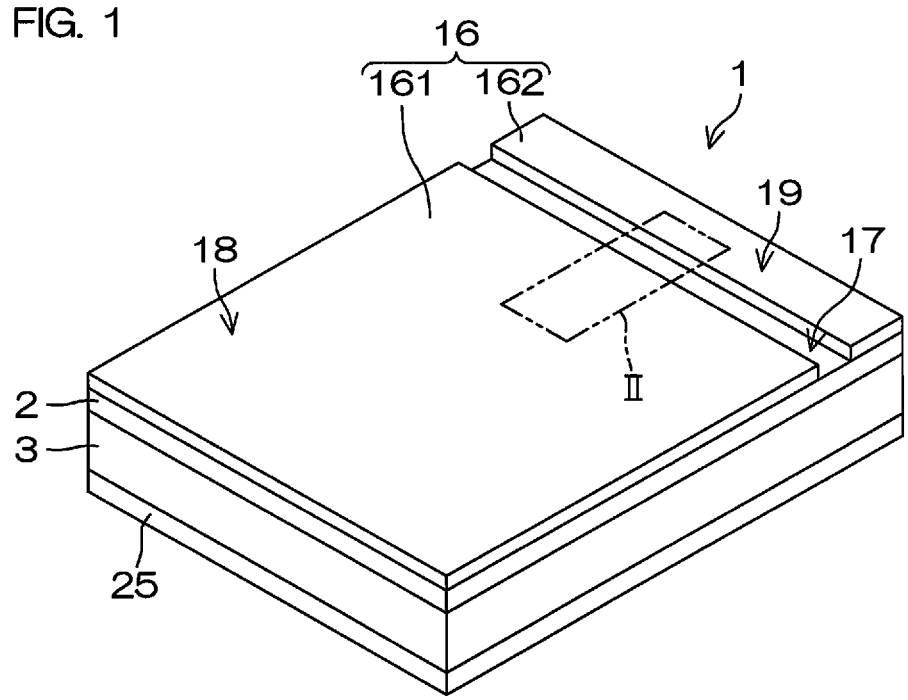
FIG. 1 is a pictorial perspective view of a semiconductor device according to a first embodiment of the present invention.

An embodiment of the present invention provides a semiconductor device that has a source region, a channel region, and a drain region disposed in order from a surface of the semiconductor device in a thickness direction of a semiconductor substrate. The semiconductor device includes a source metal embedded in a source contact groove penetrating the source region and reaching the channel region, a gate insulating film formed on a side wall of a gate trench which is formed so that the gate trench penetrates the source region and the channel region and reaches the drain region, a polysilicon gate embedded in the gate trench so that at least a region facing the channel region in the gate insulating film is covered with the polysilicon gate and so that all of the polysilicon gate is placed under a surface of the source region (i.e., under a surface of semiconductor layers), and a gate metal that is embedded in a gate contact groove formed in the polysilicon gate so as to reach a depth of the channel region and that is in contact with the polysilicon gate.

According to this arrangement, the polysilicon gate is embedded in the gate trench so that all thereof is placed under the surface of the source region. The gate metal comes into contact with the polysilicon gate through the gate contact groove. Although the gate contact groove is formed in the polysilicon gate, the polysilicon gate covers at least a region facing the channel region in the gate insulating film. Therefore, a gate structure having a laminated arrangement of the channel region/the gate insulating film/the polysilicon gate (i.e., a stack of layers in the lateral direction along the principal surface of the semiconductor substrate) is formed in at least the part facing the channel region. As a result, it is possible to realize a semiconductor device having performance (characteristics) exactly according to a predetermined design.

The gate contact groove is formed in the polysilicon gate so as to reach the depth of the channel region. On the other hand, the source contact groove is formed to have such a depth as to penetrate the source region and reach the channel region in order to join the source metal to the channel region. Therefore, the source contact groove and the gate contact groove are both formed to reach the depth of the channel region, and hence can be formed at a shared step. As a result, the number of steps to manufacture the semiconductor device can be reduced, and therefore it is possible to contribute to the improvement of productivity, and, consequently, the cost reduction of the semiconductor device can be achieved.

When an n channel type semiconductor device is manufactured, the source region and the drain region are arranged to be an n type region, whereas the channel region is arranged to be a p type region. On the other hand, when a p channel type semiconductor device is manufactured, the source region and the drain region are arranged to be a p type region, whereas the channel region is arranged to be an n type region.

The semiconductor device may be a MOS (Metal-Oxide-Semiconductor) field effect transistor, or may be an IGBT (Insulated Gate Bipolar Transistor).

Preferably, the source contact groove and the gate contact groove are formed to have a substantially equal depth. In this arrangement, the source contact groove and the gate contact groove are formed to have a substantially equal depth, and therefore these contact grooves can be formed at a shared step. As a result, the number of steps to manufacture the semiconductor device can be reduced.

The polysilicon gate may have a flush surface on the semiconductor substrate. In detail, the polysilicon gate may have a flush surface everywhere on the semiconductor substrate. Additionally, a surface of the polysilicon gate may be placed in a same plane as a surface of the semiconductor substrate.

The gate metal includes, for example, an underlying metal film with which an inner wall surface of the gate contact groove is covered and a body part embedded in the gate contact groove so as to come into contact with the underlying metal film.

The gate trench includes, for example, a plurality of individual gate trenches (at least two individual gate trenches) and a joint gate trench to which one end of each individual gate trench is joined. In this case, the polysilicon gate and the gate metal may come into contact with each other in the joint gate trench. Additionally, the plurality of individual gate trenches may extend in parallel in a stripe manner, and the joint gate trench may extend in a direction perpendicular to the individual gate trench.

Additionally, the source metal may include a source electrode, and the gate metal may include a gate electrode, and the source electrode and the gate electrode may include a pair of electrode films isolated by an isolation region. In this case, the gate electrode may be formed in an area of an end of the semiconductor device.

Additionally, the isolation region may be a linear region along a predetermined direction. For example, the isolation region may be formed in parallel with the joint gate trench.

Additionally, the isolation region may be formed so as to surround the gate electrode from three sides.

An embodiment of the present invention provides a method of manufacturing a semiconductor device that has a source region, a channel region, and a drain region disposed in order from a surface of the semiconductor device in a thickness direction of a semiconductor substrate. This manufacturing method includes a step of forming a gate trench so that the gate trench penetrates the source region and the channel region and reaches the drain region, a step of forming a gate insulating film on a side wall of the gate trench, a step of forming a polysilicon gate by embedding polysilicon in the gate trench so that at least a region facing the channel region in the gate insulating film is covered with the polysilicon gate and so that all of the polysilicon gate is placed under a surface of the source region (under a surface of semiconductor layers), a contact groove formation step of forming a source contact groove that penetrates the source region and reaches the channel region in a region different from the gate trench and simultaneously forming a gate contact groove in the polysilicon gate so as to reach a depth of the channel region, a step of embedding a source metal in the source contact groove, and a step of embedding a gate metal contiguous to the polysilicon gate in the gate contact groove.

According to this method, it is possible to manufacture a semiconductor device having the above-mentioned structure. The source contact groove and the gate contact groove are formed at the shared contact groove formation step, and therefore the number of steps can be reduced, and, accordingly, the production cost can be reduced.

Preferably, the source contact groove and the gate contact groove are formed to be equally wide (the same width). As a result, the source contact groove and the gate contact groove are easily formed at the same step. However, in order to reduce contact resistance, the gate contact groove may be formed more widely than the source contact groove. Preferably, as an example, the unit cell is highly integrated by forming the source contact groove at a minimum process size. The term "unit cell" denotes a minimum element unit including the source region, the channel region, the drain region, and the gate structure.

Embodiments of the present invention will be hereinafter described in detail with reference to the accompanying drawings.

FIG. 1 is a pictorial perspective view of a semiconductor device 1 according to a first embodiment of the present invention. The semiconductor device 1 includes an $n^+$ type (n plus type) silicon substrate 3 having an epitaxial layer 2 on its surface. An electrode film 16 including a source electrode 161 and a gate electrode 162 is formed on the epitaxial layer 2. A drain electrode 25 is formed on a reverse surface of the silicon substrate 3. The silicon substrate 3 is formed in, for example, a rectangle when viewed planarly, and, in accordance therewith, the semiconductor device 1 has a rectangular shape when viewed planarly. The electrode film 16 is formed in a rectangular region over substantially the whole area of the surface of the epitaxial layer 2. A belt-like region closer to one side of the rectangular region is used for the gate electrode 162, and the remaining rectangular region is used for the source electrode 161. In other words, the gate electrode 162 is formed in an end region of the semiconductor device 1, and the drain electrode 25 is formed in a rectangular region over substantially the whole area of the reverse surface of the silicon substrate 3.

Figure 2:
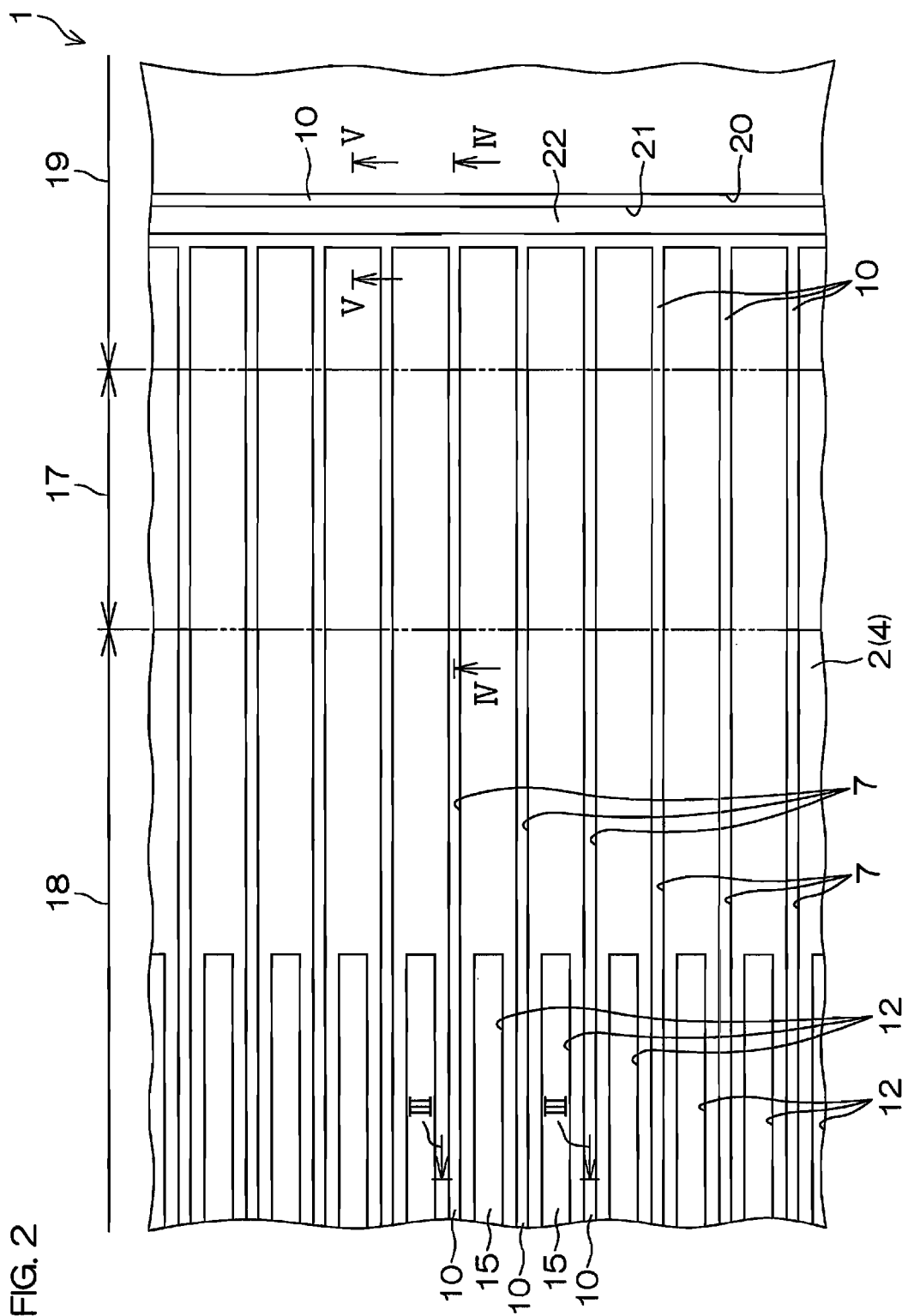
FIG. 2 is an enlarged plan view near part II of FIG. 1.
Figure 3:
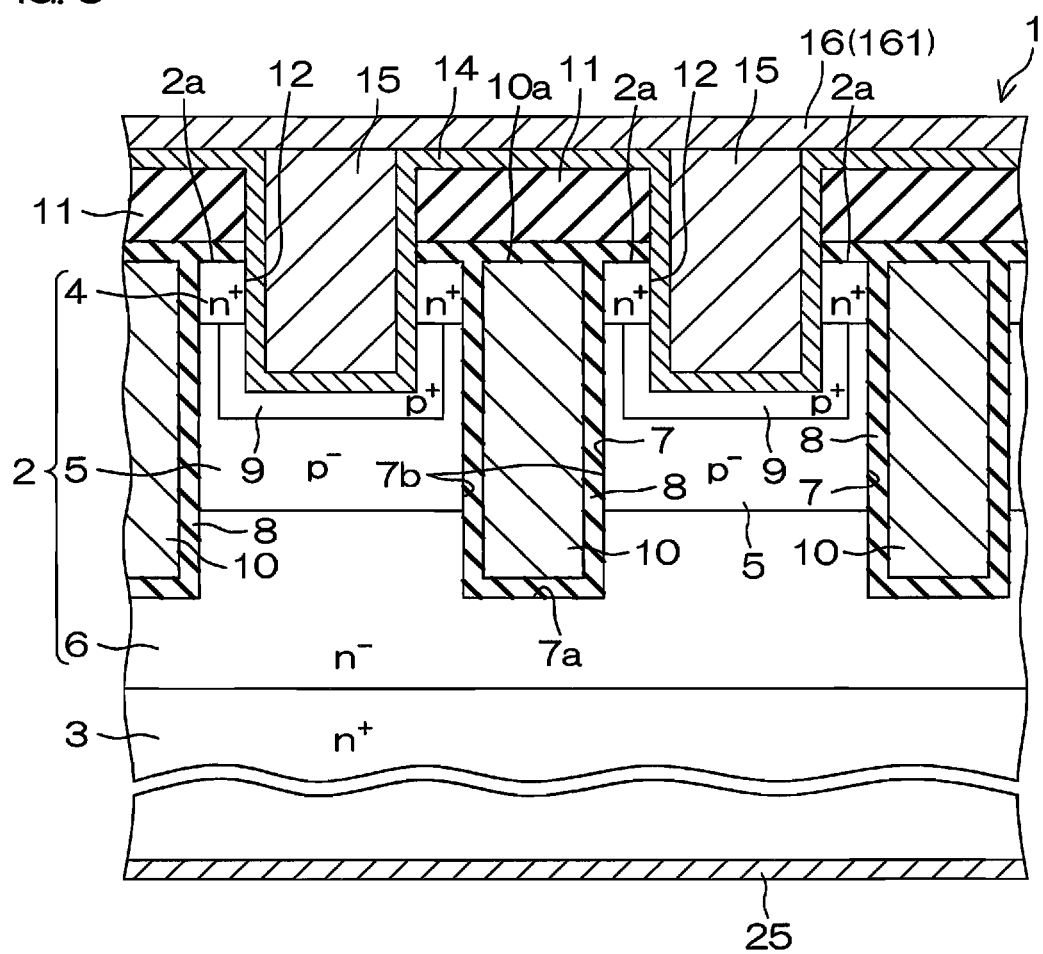
FIG. 3 is a sectional view along cutting plane line III-III of FIG. 2.
Figure 4:
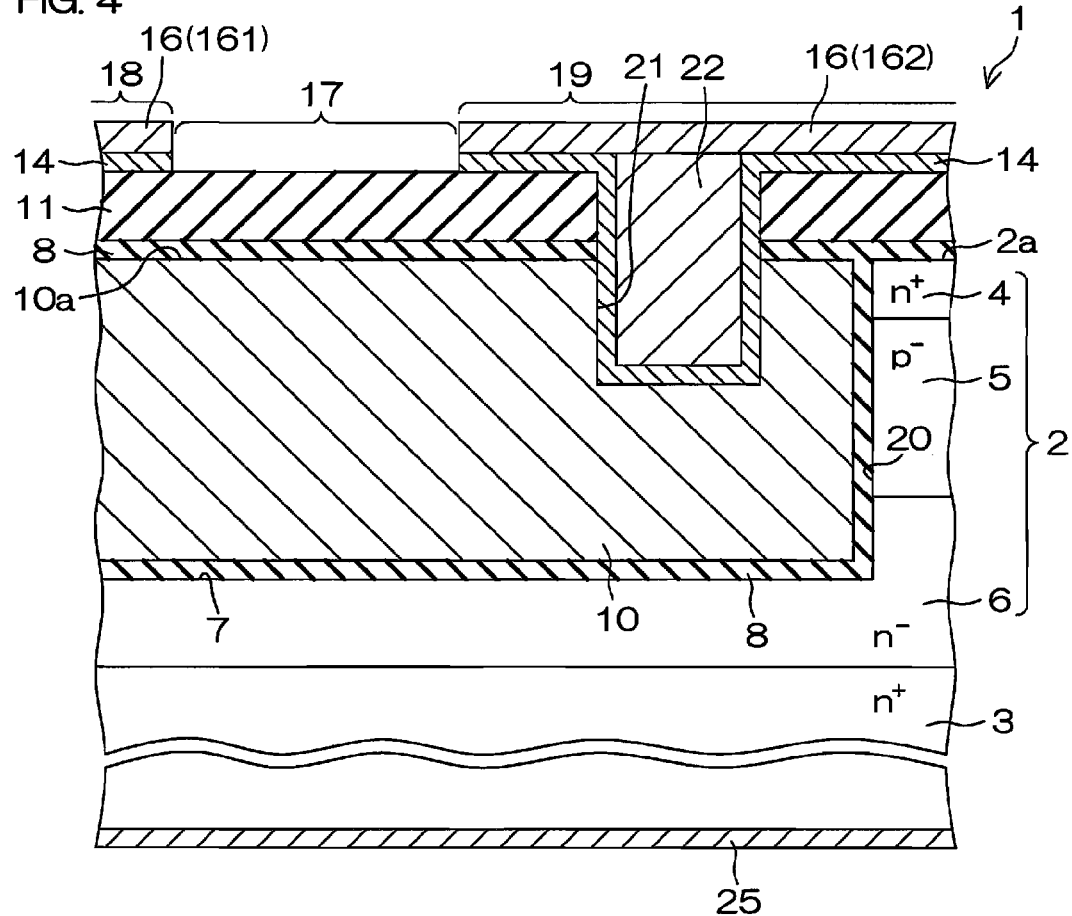
FIG. 4 is a sectional view along cutting plane line IV-IV of FIG. 2.

FIG. 2 is an enlarged plan view near part II of FIG. 1. FIG. 3 is a sectional view along cutting plane line III-III of FIG. 2, and FIG. 4 is a sectional view along cutting plane line IV-IV of FIG. 2. Note that the electrode film 16 and so forth are omitted from FIG. 2, and a structure of the surface of the epitaxial layer 2 is shown.

The epitaxial layer 2 has an $n^+$ type source region 4, a $p^-$ type (p minus type) channel region 5, and an $n^-$ type drain region 6 that are disposed in order from the surface of the semiconductor device 1 in a thickness direction of the silicon substrate 3. The thickness of the epitaxial layer 2 is, for example, about 2 μm to 20 μm. The thickness of the $n^+$ type source region 4 is, for example, about 0.2 μm, and the thickness of the $p^-$ type channel region 5 is, for example, about 0.4 μm.

The epitaxial layer 2 has a plurality of gate trenches 7 each of which has been dug from its surface and each of which is formed in a stripe. In detail, a plurality of gate trenches 7 are formed in parallel with each other at regular intervals (for example, about 0.5 μm to 3.0 μm) in a predetermined direction parallel to a principal surface of the silicon substrate 3. The gate trenches 7 have, for example, mutually equal widths (e.g., about 0.1 μm to 0.5 μm) and mutually equal lengths. Each gate trench 7 is formed so as to penetrate the source region 4 and the channel region 5 and so as to have a depth (e.g., about 0.5 μm to 2.0 μm) that reaches a certain depth part of the drain region 6. In the present embodiment, in the gate trench 7, a cutting plane that intersects its longitudinal direction is formed to be substantially rectangular.

An inner wall surface of the gate trench 7 is covered with the gate insulating film 8. The gate insulating film 8 is made of, for example, a silicon oxide film, and its film thickness is about 100 Å to 1000 Å. A bottom surface 7a and a side wall 7b of the gate trench 7 are covered with the gate insulating film 8, and the surface of the epitaxial layer 2 outside the gate trench 7 is also covered with the gate insulating film 8. A polysilicon gate 10 is embedded in the gate trench 7 so as to be contiguous to the gate insulating film 8. The polysilicon gate 10 is embedded in the gate trench 7 so that the entire polysilicon gate 10 is placed under the surface of the epitaxial layer 2 (i.e., under the surface of the source region 4). In other words, an upper surface 10a of the polysilicon gate 10 is placed at a depth position under the surface 2a of the epitaxial layer 2 (i.e., at a position equal to or deeper than the position of the surface 2a). In the present embodiment, the upper surface 10a of the polysilicon gate 10 is placed in the same plane as the surface 2a of the epitaxial layer 2 (i.e., the surface of the silicon substrate 3). Additionally, in the present embodiment, the upper surface 10a of the polysilicon gate 10 is a flush surface in all regions on the silicon substrate 3. The upper surface 10a of the polysilicon gate 10 is covered with the gate insulating film 8. In other words, the polysilicon gate 10 is surrounded by the gate insulating film 8.

An interlayer insulating film 11 is formed on the gate insulating film 8 with which the surface of the epitaxial layer 2 is covered. The interlayer insulating film 11 is made of, for example, a silicon oxide film. A source contact groove 12 is formed between the adjoining gate trenches 7 that serve as a pair. From another viewpoint, it may safely be said that each gate trench 7 is formed between adjoining source contact grooves 12 that serve as a pair.

Each of the source contact grooves 12 is shaped into a stripe. In detail, the source contact grooves 12 are formed in parallel with each other at regular intervals (e.g., about 0.5 µm to 3.0 µm). In the present embodiment, the source contact grooves 12 have substantially mutually-equal widths (e.g., 0.1 µm to 0.5 µm) and substantially mutually-equal depths (e.g., about 0.3 µm). The source contact groove 12 has such a depth as to penetrate the interlayer insulating film 11, to penetrate the source region 4, and to reach a depth part of the channel region 5.

The underlying metal film 14 is formed so as to cover the interlayer insulating film 11 and the inner wall surface of a part in the epitaxial layer 2 of the source contact groove 12. A metal plug 15 is embedded in the source contact groove 12 so as to come into contact with the underlying metal film 14. An electrode film 16 is formed on the underlying metal film 14 and the surface of the metal plug 15. The underlying metal film 14, the metal plug 15, and the electrode film 16 compose a source metal. The metal plug 15 and the electrode film 16 compose a body part of the source metal. In the channel region 5, a $p^+$ type region 9 is formed in an area that has a predetermined thickness and that faces the source contact groove 12. The $p^+$ type region 9 contributes to an ohmic contact between the channel region 5 and the underlying metal film 14.

The electrode film 16 is formed over an area equivalent to the entire surface of the silicon substrate 3, and has a source electrode 161 and a gate electrode 162 that are insulated by an isolation region 17. In other words, the source electrode 161 and the gate electrode 162 include a pair of electrode films isolated by the isolation region 17. In the present embodiment, the isolation region 17 is a linear region along a side of the semiconductor device 1. The underlying metal film 14 is made of, for example, a laminated film consisting of a titanium film and a titanium nitride film. The metal plug 15 is made of, for example, tungsten. The electrode film 16 is made of, for example, an aluminum film or an aluminum-copper alloy film.

As shown in FIG. 2, the source contact groove 12 remains in a cell formation region 18 placed closer to the source electrode 161 than to the isolation region 17. On the other hand, the gate trench 7 extends from the cell formation region 18 toward the isolation region 17, then passes through the isolation region 17, and reaches a gate contact region 19 closer to the gate electrode 162 than to the isolation region 17. A joint gate trench 20 that joins the gate trenches 7 together is formed in the gate contact region 19. In detail, the joint gate trench 20 is formed so as to extend in a direction in which the gate trenches 7 are arranged one by one, i.e., so as to extend in a direction perpendicular to the longitudinal direction of the individual gate trench 7. An end of the individual gate trench 7 is joined to the joint gate trench 20. The inner wall surface of the joint gate trench 20 is covered with the gate insulating film 8. The polysilicon gate 10 continuous from the individual gate trench 7 is embedded in the joint gate trench 20. The width of the joint gate trench 20 is greater (e.g., 0.1 µm to 2.0 µm) than, for example, the width of the individual gate trench 7. In the present embodiment, the depth of the joint gate trench 20 is equal to the depth of the individual gate trench 7, and is, for example, about 0.5 µm to 2.0 µm. Additionally, in the present embodiment, the isolation region 17 extends in parallel with the joint gate trench 20.

Figure 5:
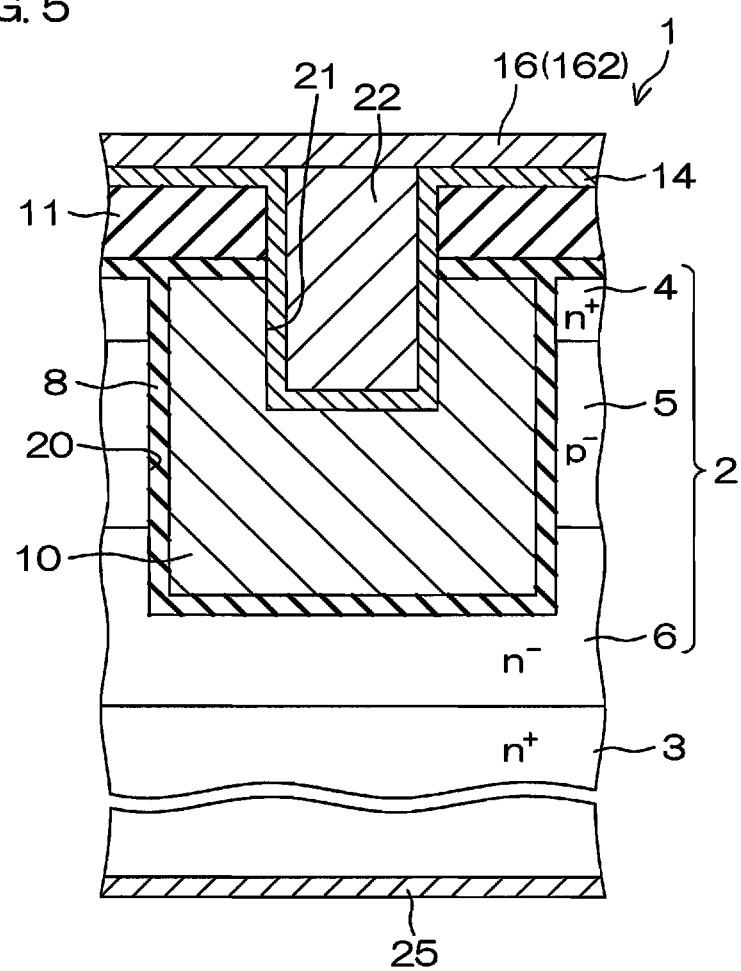
FIG. 5 is a sectional view along cutting plane line V-V of FIG. 2.

FIG. 5 is a sectional view along cutting plane line V-V of FIG. 2. A gate contact groove 21 that penetrates the interlayer insulating film 11 and that reaches the polysilicon gate 10 in the joint gate trench 20 is formed in a region corresponding to the joint gate trench 20. The gate contact groove 21 is shaped like a belt in the longitudinal direction of the joint gate trench 20. The gate contact groove 21 is formed so as to be substantially equal in depth to the source contact groove 12, and has its inner wall surface on which the underlying metal film 14 is formed. A metal plug 22 is embedded in the gate contact groove 21 so as to come into contact with the underlying metal film 14. The metal plug 22 is made of the same material as the metal plug 15 embedded in the source contact groove 12. The gate electrode 162 (electrode film 16) is formed so as to come into contact with the metal plug 22 and with the underlying metal film 14 outside the gate contact groove 21. The underlying metal film 14, the metal plug 22, and the gate electrode 162 compose a gate metal. The metal plug 22 and the gate electrode 162 compose a body part of the gate metal. In the present embodiment, the gate metal is contiguous to the polysilicon gate 10 in the joint gate trench 20. The underlying metal film 14 is isolated in the isolation region 17 in the same way as the electrode film 16. As a result, the source electrode 161 and the gate electrode 162 are electrically insulated from each other.

When necessary, a surface protective film (not shown) is formed to cover a surface of the electrode film 16 and that of the isolation region 17. In the silicon substrate 3, an electrode film serving as the drain electrode 25 is formed on the whole of its reverse surface opposite to the epitaxial layer 2.

FIGS. 6A and 6B through FIGS. 15A and 15B are schematic sectional views for describing manufacturing process steps of the semiconductor device according to the present embodiment. Each of FIG. 6A to FIG. 15A shows a cross-sectional structure in a cutting plane that is the same as FIG. 3, whereas each of FIG. 6B to FIG. 15B shows a cross-sectional structure in a cutting plane that is the same as FIG. 5.

As shown in FIG. 6A and FIG. 6B, first, the $n^+$ type silicon substrate 3 having its surface on which the $n^-$ type epitaxial layer 2 has been formed is prepared. Thereafter, the n type epitaxial layer 2 undergoes gate trench etching by which the individual gate trench 7 and the joint gate trench 20 are simultaneously formed. In more detail, dry etching (e.g., reactive ion etching) is performed to form the gate trenches 7 and 20 from the surface of the n type epitaxial layer 2.

Figure 7B:
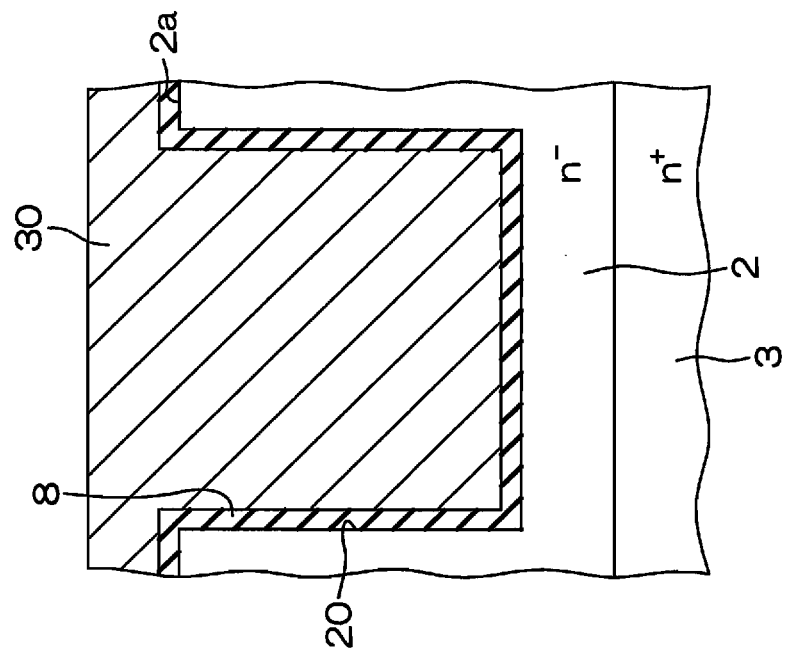
FIG. 7A and FIG. 7B are schematic sectional views for describing steps subsequent to those shown in FIG. 6A and FIG. 6B.
Figure 7A:
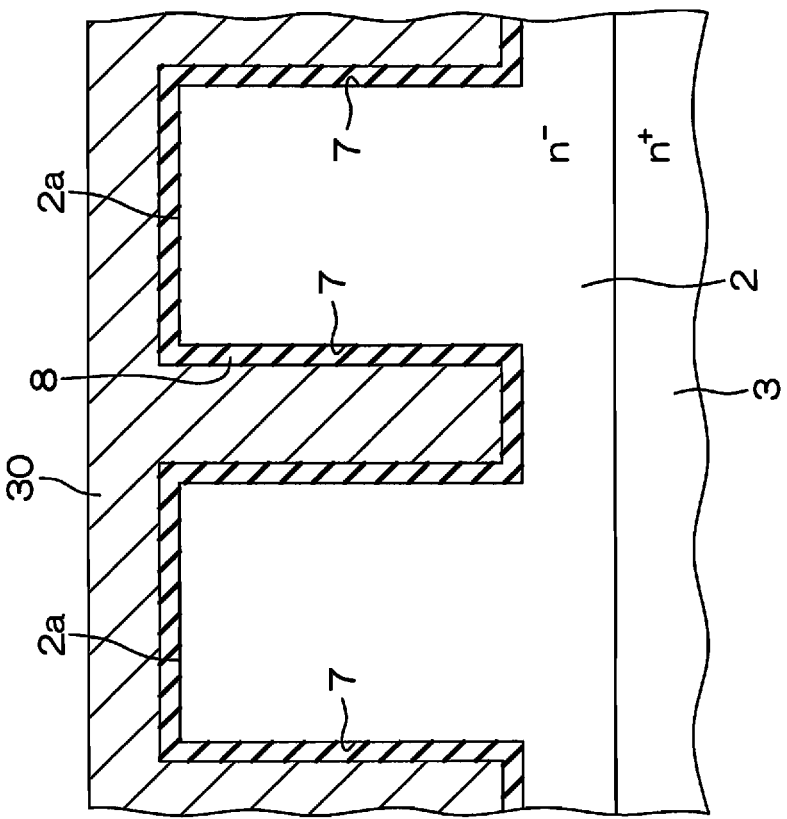

Thereafter, the gate insulating film 8 made of a silicon oxide film is formed on an exposed surface of the n⁻ type epitaxial layer 2 according to a thermal oxidation method as shown in FIG. 7A and FIG. 7B. The gate insulating film 8 covers the bottom surfaces and side walls of the gate trenches 7 and 20, and covers the surface 2a of the epitaxial layer 2 outside the gate trenches 7 and 20. Thereafter, a CVD method (chemical vapor deposition method) is applied to the entire surface of the epitaxial layer 2, and, as a result, a polysilicon film 30 is formed. The polysilicon film 30 is doped with n type or p type impurities so as to achieve its low resistivity. The polysilicon film 30 is deposited on the epitaxial layer 2 so that it comes into contact with the gate insulating film 8, so that the gate trenches 7 and 20 are filled therewith, and so that it becomes higher than the surface 2a of the epitaxial layer 2.

Thereafter, the polysilicon film 30 is etched, and a part of the polysilicon film 30 outside the gate trenches 7 and 20 is removed as shown in FIG. 8A and FIG. 8B. In detail, the polysilicon film 30 is etched until its surface becomes flush with the surface 2a of the epitaxial layer 2 or until its surface becomes lower than the surface 2a of the epitaxial layer 2. As a result, the polysilicon film 30 is left only in the gate trenches 7 and 20, and the polysilicon gate 10 is created. The polysilicon gate 10 is etched so as to have its surface above the depth of a predetermined region in which the channel region 5 is formed and so as to have its surface below the surface 2a of the epitaxial layer 2. After completing this etching step, an insulating film 31 is formed so as to cover the upper surface of the polysilicon gate 10 in the gate trenches 7 and 20. The insulating film 31 is, for example, a thermally-oxidized film formed by oxidizing the upper surface of the polysilicon gate 10, and is integrated with the gate insulating film 8.

Thereafter, p type impurity ions are injected and diffused into the epitaxial layer 2, and, as a result, the p⁻ type channel region 5 is formed as shown in FIG. 9A and FIG. 9B. Furthermore, n type impurity ions are injected and diffused into a surface part of the epitaxial layer 2, thus forming the n⁺ type source region 4 placed closer to the surface of the epitaxial layer 2 than to the channel region 5. The epitaxial layer 2 between the channel region 5 and the silicon substrate 3 serves as the drain region 6. In the polysilicon gate 10 embedded in the gate trenches 7 and 20, the surface 10a of the polysilicon gate 10 is flush with the upper surface of the source region 4 (i.e., flush with the surface 2a of the epitaxial layer 2), or is placed within the depth range of the source region 4.

Thereafter, the interlayer insulating film 11 is formed on the surface of the insulating film 8 as shown in FIG. 10A and FIG. 10B. The interlayer insulating film 11 is made of, for example, a silicon oxide film formed according to the CVD method.

Thereafter, the source contact groove 12 is formed in a region between the gate trenches 7, and the gate contact groove 21 is formed in the region of the joint gate trench 20 as shown in FIG. 11A and FIG. 11B. In detail, a resist mask 33 having a pattern provided with openings corresponding to the source and gate contact grooves 12 and 21 is formed on the interlayer insulating film 11. The interlayer insulating film 11 and the gate insulating film 8 are etched through the resist mask 33, and, furthermore, the epitaxial layer 2 and the polysilicon gate 10 placed thereunder are etched. This etching operation is performed by, for example, dry etching (reactive ion etching). In this way, the source contact groove 12 and the gate contact groove 21 are simultaneously formed at the same step. Therefore, these contact grooves 12 and 21 have substantially the same depth.

The source contact groove 12 is formed between the neighboring gate trenches 7 with an interval between the source contact groove 12 and the individual gate trench 7. The gate contact groove 21 is formed so that the polysilicon gate 10 is left therearound and so that the gate contact groove 21 faces the gate insulating film 8 formed on the side wall of the joint gate trench 20 through the polysilicon gate 10. The source contact groove 12 is formed so as to penetrate the source region 4 and have a depth to reach the channel region 5. Therefore, the gate contact groove 21 is deeper than the source region 4, and its bottom surface is placed within the depth range of the channel region 5. The gate contact groove 21 is shaped into a narrower belt than the joint gate trench 20, and is formed at substantially the center in the width direction of the gate contact groove 21. As a result, the gate contact groove 21 is formed in the polysilicon gate 10 inside the joint gate trench 20.

Figure 12B:
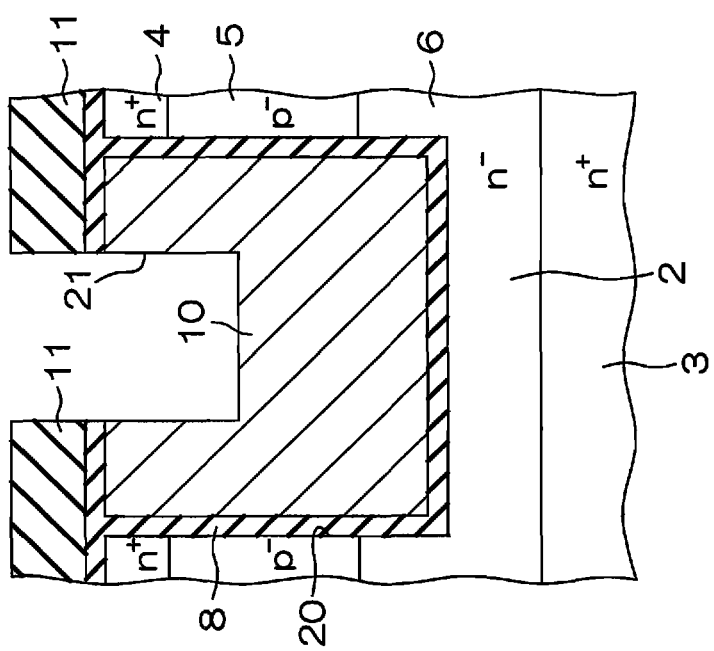
FIG. 12A and FIG. 12B are schematic sectional views for describing steps subsequent to those shown in FIG. 11A and FIG. 11B.
Figure 12A:
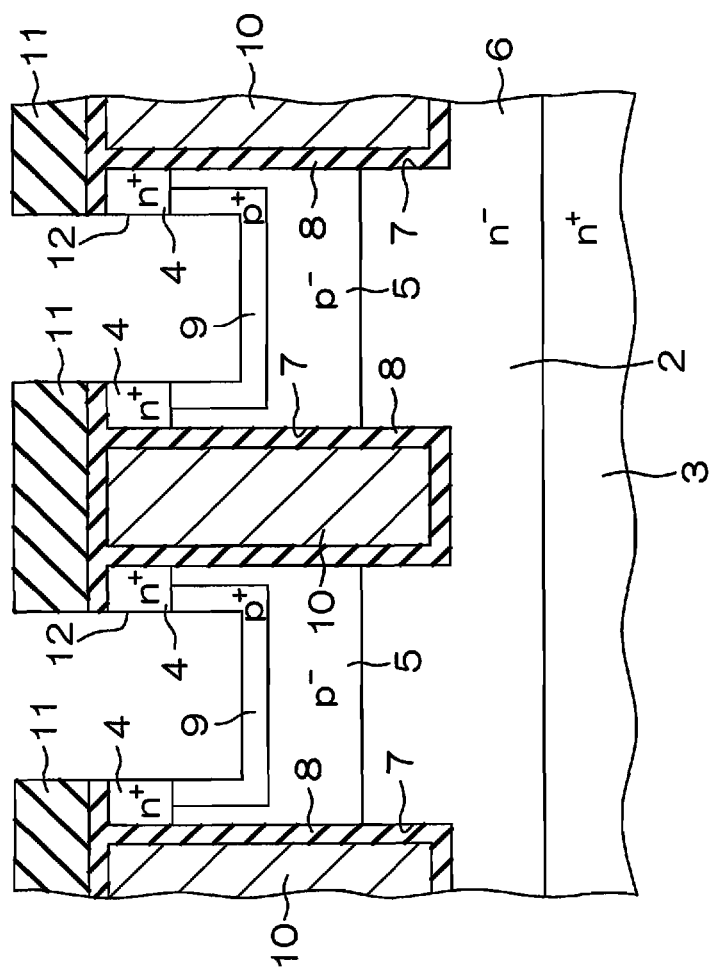

Thereafter, p type impurity ions are selectively injected into a bottom part of the source contact groove 12 as shown in FIG. 12A and FIG. 12B. As a result, a p⁺ type region 9 is formed in the channel region 5 in the bottom area of the source contact groove 12.

Figure 13B:
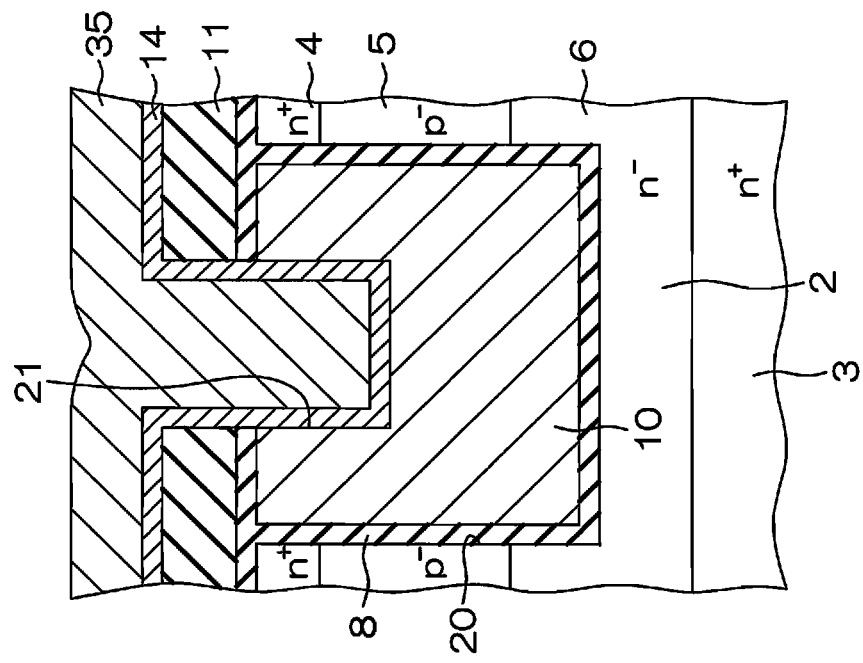
FIG. 13A and FIG. 13B are schematic sectional views for describing steps subsequent to those shown in FIG. 12A and FIG. 12B.
Figure 13A:
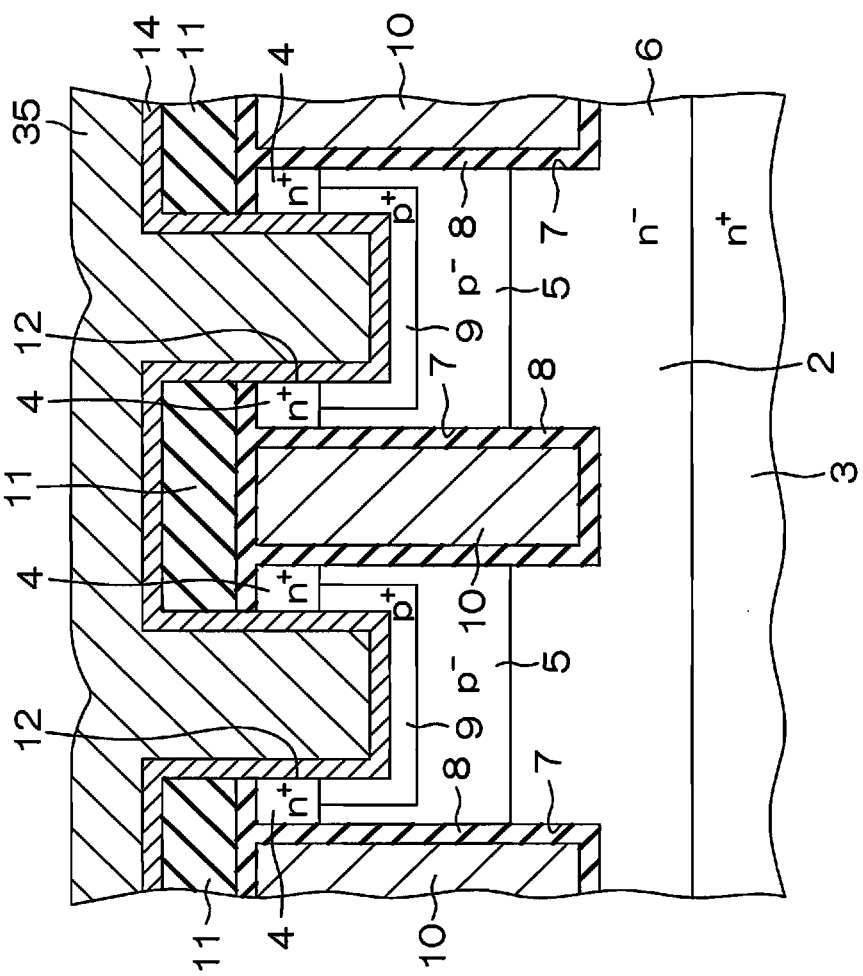

Furthermore, the underlying metal film 14 and a plug metal film 35 that is used for plugs are formed in this order on the entire surface of the epitaxial layer 2 as shown in FIG. 13A and FIG. 13B. In detail, the underlying metal film 14 is formed so as to come into contact with the inner wall surface of the source contact groove 12, with the inner wall surface of the gate contact groove 21, and with the upper surface of the interlayer insulating film 11. The underlying metal film 14 may be, for example, a laminated film consisting of a titanium film and a titanium nitride film. In this case, the titanium film is arranged as a lower film, and the titanium nitride film is arranged as an upper film. The plug metal film 35 is laid on the thus formed underlying metal film 14. The plug metal film 35 is made of, for example, tungsten.

Figure 14B:
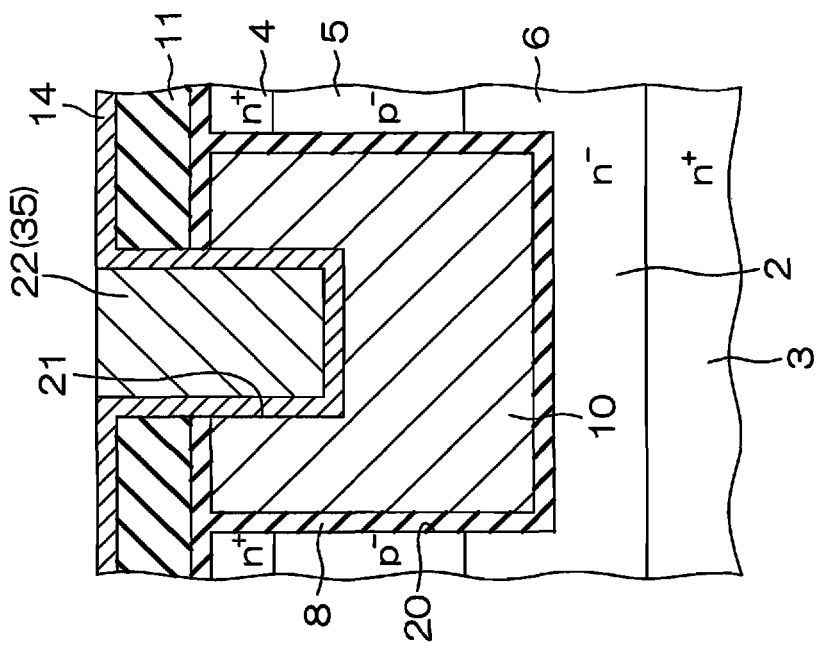
FIG. 14A and FIG. 14B are schematic sectional views for describing steps subsequent to those shown in FIG. 13A and FIG. 13B.
Figure 14A:
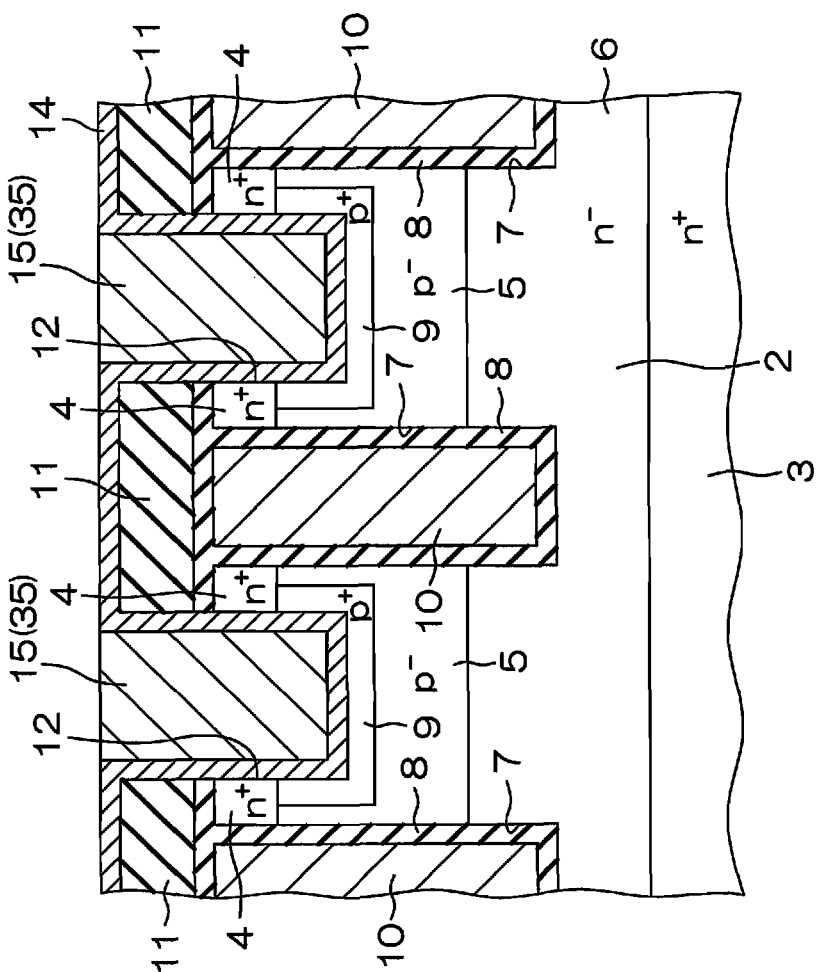

Thereafter, the entire surface of the plug metal film 35 is etched as shown in FIG. 14A and FIG. 14B. As a result, the plug metal film 35 is left only in the gate contact groove 21 and the source contact groove 12, and these remaining parts serve as the metal plugs 15 and 22, respectively. If the underlying metal film 14 is provided in the form of a laminated film consisting of a titanium film and a titanium nitride film, etching onto the plug metal film 35 is stopped at the titanium film. In other words, etching onto the plug metal film 35 can be stopped by using the titanium film as an etching stop layer in a state in which the plug metal film 35 is left only in the source contact groove 12 and the gate contact groove 21.

Thereafter, the electrode film 16 is formed on the entire surface as shown in FIG. 15A and FIG. 15B. The electrode film 16 is made of, for example, an aluminum film or an aluminum-copper alloy film. The electrode film 16 may be formed according to, for example, a sputtering method.

Thereafter, the electrode film 16 and the underlying metal film 14 in the isolation region 17 shown in FIGS. 1, 2, and 4 are selectively etched and removed. As a result, the source electrode 161 and the gate electrode 162 are divided separately from each other. Thereafter, the drain electrode 25 is formed on the reverse surface of the silicon substrate 3. The drain electrode 25 may be, for example, a laminated film including a titanium film, a nickel film, and a silver film that are laid in order from the silicon-substrate side (3).

As described above, according to the present embodiment, the polysilicon gate 10 is formed only in the gate trenches 7 and 20, and does not have a stranded portion that is stranded on the surface 2a of the epitaxial layer 2. Therefore, the application of a large electric field onto this portion is avoidable even if the film thickness of the gate insulating film 8 at the opening edges of the gate trenches 7 and 20 is somewhat diminished. As a result, it is possible to provide a MOSFET excellent in the amount of resistance against a dielectric breakdown.

Additionally, in the structure of the present embodiment, the polysilicon gate 10 is disposed at all parts facing the channel region 5 in the gate trenches 7 and 20. In detail, a laminated structure of the channel region/gate insulating film/polysilicon gate is formed in all regions near the surface of the channel region 5. In other words, a laminated structure of the channel region/gate insulating film/metal does not exist in any areas. As a result, the semiconductor device 1 has a structure capable of easily obtaining performance (characteristics) exactly according to a predetermined design.

Still additionally, the source contact groove 12 and the gate contact groove 21 are simultaneously formed at the same step. As a result, the number of manufacturing process steps can be reduced, and therefore it is possible to contribute to a decrease in production cost.

In other words, the present embodiment provides a semiconductor device that has a sufficient amount of resistance against a dielectric breakdown, that is capable of easily obtaining performance (characteristics) exactly according to a predetermined design, and that is, however, small in the number of manufacturing process steps.

Figure 16:
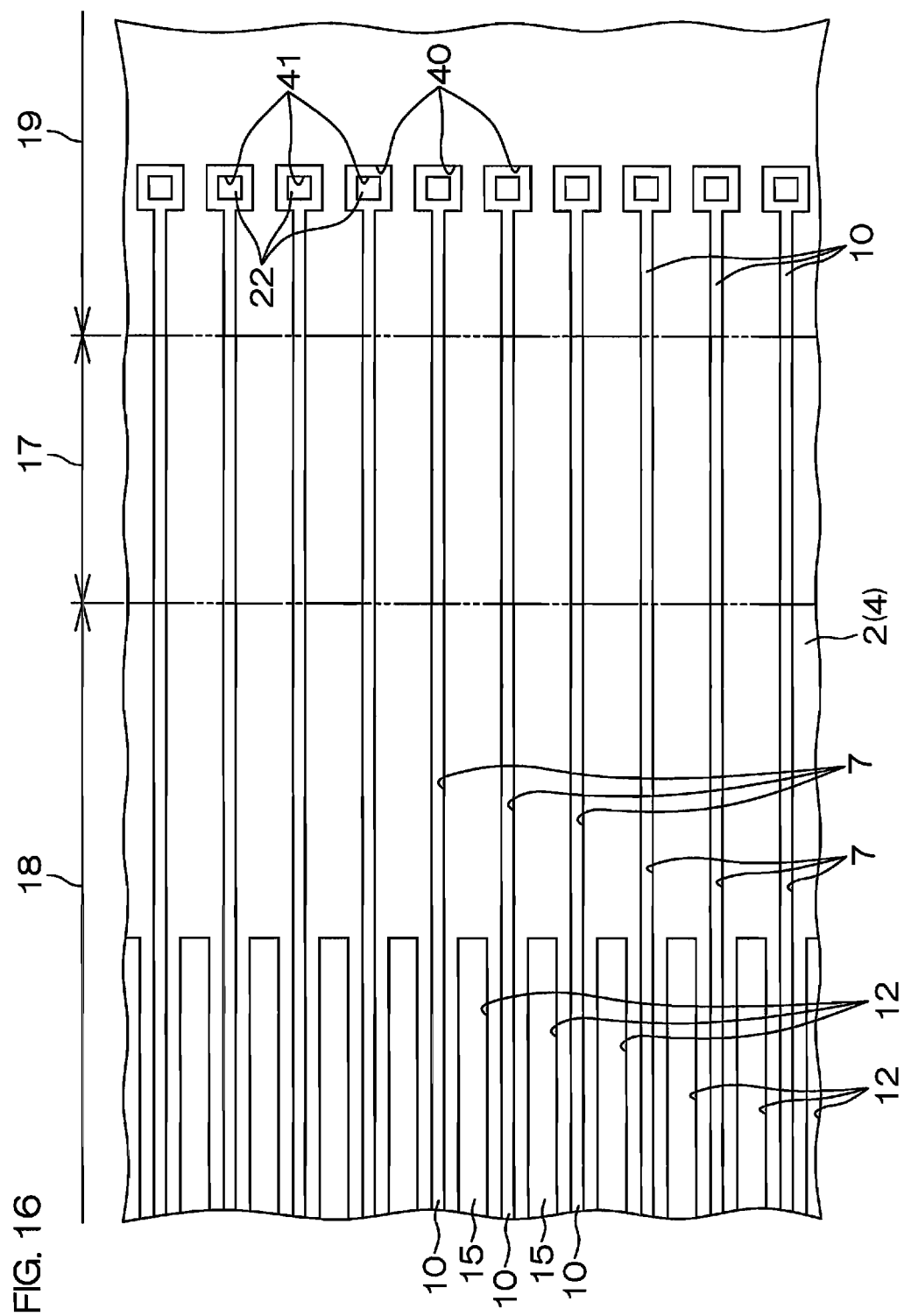
FIG. 16 is a plan view for describing an arrangement of a semiconductor device according to a second embodiment of the present invention.

FIG. 16 is a plan view for describing an arrangement of a semiconductor device according to a second embodiment of the present invention. In FIG. 16, the same reference numeral as in FIG. 2 is given to a component corresponding to each component shown in FIG. 2.

In the present embodiment, a contact gate trench 40 that is used for contacts is formed at the end of the individual gate trench 7 instead of the joint gate trench 20 of the first embodiment. In the example of FIG. 16, the contact gate trenches 40 are not joined to each other, and are disposed separately from each other with an interval therebetween. The contact gate trench 40 is shaped into, for example, a rectangle (e.g., a substantially square shape) whose width is greater than the width of the gate trench 7.

The polysilicon gate 10 continuous from the inside of the gate trench 7 is embedded in each contact gate trench 40 in the same way as in the first embodiment. A gate contact groove 41 is formed in an area surrounded by the polysilicon gate 10 in the contact gate trench 40. The gate contact groove 41 does not come into contact with any side walls of the contact gate trench 40. Therefore, the polysilicon gate 10 is interposed between the gate contact groove 41 and the inner wall of the contact gate trench 40. The metal plug 22 is embedded in the gate contact groove 41. Accordingly, the metal plugs 22 embedded in the gate contact grooves 41, respectively, are brought into contact with the gate electrode 162 formed on the interlayer insulating film 11 in a shared manner (see FIG. 5).

Figure 17:
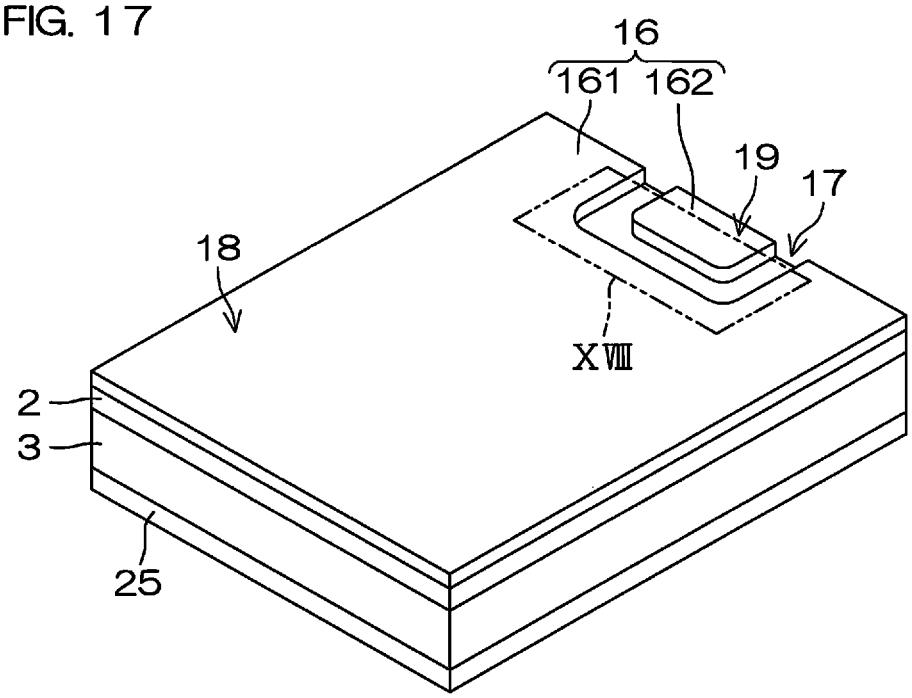
FIG. 17 is a perspective view of a semiconductor device according to a third embodiment of the present invention.
Figure 18:
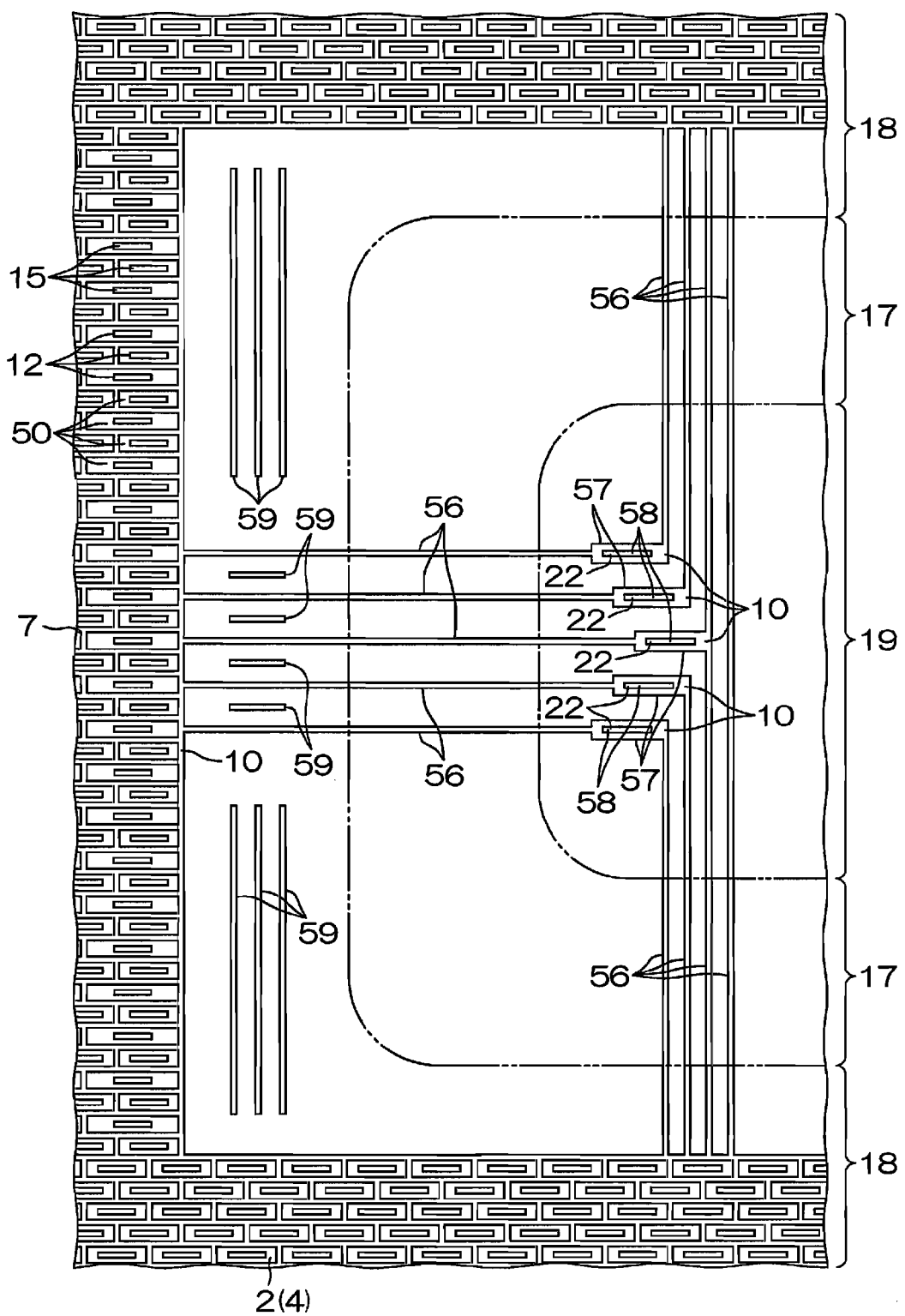
FIG. 18 is an enlarged plan view near part XVIII of FIG. 17.

FIG. 17 is a perspective view of a semiconductor device according to a third embodiment of the present invention. FIG. 18 is a plan view similar to FIG. 2, and shows part XVIII of FIG. 17 by enlarging it. In FIG. 17 and FIG. 18, the same reference numeral as in FIG. 1 and FIG. 2 is given to a component corresponding to each component shown in FIG. 1 and FIG. 2.

In the present embodiment, an angular U-shaped cell formation region 18 and a gate contact region 19 surrounded by the cell formation region 18 from the three sides are set on the epitaxial layer 2. In the cell formation region 18, a gate trench 7 having a mesh pattern is formed on the epitaxial layer 2. The gate trench 7 is formed into a pattern in which a plurality of rectangular, mesh regions are sectioned in the epitaxial layer 2. Each mesh region is formed as one cell 50. A source contact groove 12 is formed in the center of each cell 50.

A source electrode 161 is formed in the cell formation region 18 in such a way as to cover substantially the entire region thereof. Additionally, a gate electrode 162 is formed in the gate contact region 19 in such a way as to cover substantially the entire region thereof. A substantially U-shaped isolation region 17 is disposed between the source electrode 161 and the gate electrode 162. The source electrode 161 and the gate electrode 162 are insulated from each other by the isolation region 17. The isolation region 17 is formed so as to surround the gate electrode 162 from the three sides.

A connection gate trench 56 that leads to the gate contact region 19 through the isolation region 17 branches from the gate trench 7. The connection gate trench 56 is formed so as to approach the gate contact region 19 from three directions with a difference of 90° therebetween, and is joined to the contact gate trench 57 formed in the gate contact region 19. In this example, a plurality of contact gate trenches 57 (e.g., five contact gate trenches) are disposed in the gate contact region 19. The contact gate trench 57 is formed so as to be wider than the gate trench 7 and the connection gate trench 56.

The gate trench 7, the connection gate trench 56, and the contact gate trench 57 have the same depth, and the polysilicon gate 10 is embedded in each of these trenches. A gate contact groove 58 is formed in an inner region of the contact gate trench 57. The metal plug 22 is embedded in the gate contact groove 58, and the gate electrode 162 is in contact with the metal plug 22.

The gate contact groove 58 is formed separately from the inner wall of the contact gate trench 57 with an interval therebetween, and the polysilicon gate 10 is interposed between the gate contact groove 58 and the inner wall of the contact gate trench 57.

In the cell formation region 18, body contact grooves 59 are formed at a plurality of places, respectively, between the isolation region 17 and the gate trench 7. Likewise, another body contact groove 59 is formed in a region between the connection gate trenches 56. These body contact grooves 59 are contact grooves that reach the p⁻ type channel region 5 (see FIG. 3, for example) in the epitaxial layer 2. Metal plugs made of, for example, tungsten are embedded in the body contact grooves 59, respectively. These metal plugs are connected to the source electrode 161. An n⁺ type region to form the source region is not formed in a region that does not have the cell 50. Therefore, in order to stabilize the electric potential of the p⁻ type channel region 5, the source electrode 161 is connected to the p⁻ type channel region 5 through the body contact groove 59.

Although the three embodiments of the present invention have been described as above, the present invention can be embodied in still other forms. For example, in the above-mentioned embodiments, the metal plug made of tungsten is embedded in the contact grooves 12, 21, 41, 54, 58, and 59.

However, if the width of each of these contact grooves is sufficiently large, the step of embedding the metal plug made of tungsten may be omitted, and an electrode film made of aluminum or aluminum-copper alloy may be embedded in the contact groove.

Additionally, although the n channel type MOSFET in which the source region and the drain region are each arranged as an n type and in which the channel region is arranged as a p type have been shown in the abovementioned embodiments, it is permissible to employ a p channel type MOSFET in which the source region and the drain region are each arranged as a p type region and in which the channel region is arranged as an n type region.

Additionally, although the MOSEFT has been described as an example in the above-mentioned embodiments, the present invention is also applicable to a semiconductor device having another structure, such as an IGBT (Insulated Gate Bipolar Transistor).

Still additionally, in the above-mentioned embodiments, a gate contact groove is not formed in the polysilicon gate 10 in the gate trench 7 formed in the cell formation region 18. However, a gate contact groove may be formed in the polysilicon gate 10 in the gate trench 7 formed in the cell formation region 18, and a metal (electrode film) for wiring may be embedded in the gate contact groove. Likewise, in this case, the gate contact groove is formed so as to have a sufficient interval between the gate contact groove and the inner wall of the gate trench 7, and the polysilicon gate 10 is interposed everywhere between the gate contact groove and the inner wall of the gate trench 7.

Although the embodiments of the present invention have been described in detail as above, these are merely specific examples used to clarify the technical contents of the present invention, and the present invention should not be understood as being limited to these examples, and the scope of the present invention is to be determined solely by the appended claims.

What is claimed is:

1. A method of manufacturing a semiconductor device that has a source region, a channel region, and a drain region disposed in order from a surface of the semiconductor device in a thickness direction of a semiconductor substrate, the method comprising:
    a step of forming a gate trench in the semiconductor substrate so that the gate trench penetrates regions where the source region and the channel region are to be formed, respectively, and reaches the drain region;
    a step of forming a gate insulating film on a side wall of the gate trench, wherein the gate insulating film is formed so as to have a first extended portion that covers the surface of the semiconductor substrate outside of the gate trench;
    a step of forming a polysilicon gate by embedding polysilicon in the gate trench so that at least a portion of the gate insulating film facing the region of the semiconductor substrate where the channel region is to be formed is covered with the polysilicon gate and so that all of the polysilicon gate is placed under a surface of the semiconductor substrate;
    a step of forming a second extended portion of the gate insulating film that covers a top surface of the polysilicon gate embedded in the gate trench such that the second extended portion is to be integral with the first extended portion of the gate insulating film and a portion of the gate insulating film on the side wall of the gate trench;
    a step of forming the channel region in the semiconductor substrate;
    a step of forming the source region in the semiconductor substrate so as to be placed closer to the surface of the substrate than the channel region;
    a step of forming an interlayer insulating film on the first and second extended portions of the gate insulating film;
    a contact groove formation step of forming a source contact groove that penetrates the source region and reaches the channel region in a region different from the gate trench and simultaneously forming a gate contact groove in the polysilicon gate so as to reach a depth of the channel region wherein the source contact groove is formed so as to penetrate the interlayer insulating film and the first extended portion of the gate insulating film, and the gate contact groove is formed so as to penetrate the interlayer insulating film, the second extended portion of the gate insulating film, and the top surface of the polysilicon gate;
    a step of embedding a source metal in the source contact groove; and
    a step of embedding a gate metal contiguous to the polysilicon gate in the gate contact groove.

2. The method according to claim 1, wherein the source contact groove and the gate contact groove are formed to have a substantially equal depth.

3. The method according to claim 1, wherein the polysilicon gate is formed to have a flush surface on the semiconductor substrate.

4. The method according to claim 1, wherein the polysilicon gate is formed so that a surface of the polysilicon gate is placed in a same plane as a surface of the semiconductor substrate.

5. The method according to claim 1, wherein the step of embedding the gate metal in the gate contact groove includes a step of forming an underlying metal film with which an inner wall surface of the gate contact groove is covered and a step of embedding a body part in the gate contact groove so as to come into contact with the underlying metal film.

6. The method according to claim 1, wherein the gate trench is formed so as to include a plurality of individual gate trenches and a joint gate trench to which one end of each individual gate trench is joined, and
    the gate metal is formed so as to come into contact with the polysilicon gate in the joint gate trench.

7. The method according to claim 6, wherein the plurality of individual gate trenches are formed so as to extend in parallel in a stripe manner, and
    the joint gate trench is formed so as to extend in a direction perpendicular to the individual gate trench.

8. The method according to claim 1, wherein the source metal includes a source electrode, and the gate metal includes a gate electrode, the method further comprising:
    a step of forming an electrode film;
    a step of forming an isolation region in the electrode film separating the source electrode and the gate electrode.

9. The method according to claim 8, wherein the gate electrode is formed in an area of an end of the semiconductor device.

10. The method according to claim 8, wherein the isolation region is a linear region along a predetermined direction.

11. The method according to claim 8, wherein the isolation region is formed so as to surround the gate electrode from three sides.

\* \* \* \* \*